US012066392B2

(12) United States Patent
Hashimoto et al.

(10) Patent No.: US 12,066,392 B2
(45) Date of Patent: Aug. 20, 2024

(54) EXCITATION LIGHT IRRADIATING APPARATUS AND EXCITATION LIGHT IRRADIATING METHOD

(71) Applicants: SUMIDA CORPORATION, Tokyo (JP); Kyoto University, Kyoto (JP)

(72) Inventors: Masateru Hashimoto, Komoro (JP); Yoshiharu Yoshii, Natori (JP); Yuki Takemura, Kyoto (JP); Norikazu Mizuochi, Kyoto (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 127 days.

(21) Appl. No.: 17/922,500

(22) PCT Filed: Apr. 19, 2021

(86) PCT No.: PCT/JP2021/015814
§ 371 (c)(1),
(2) Date: Oct. 31, 2022

(87) PCT Pub. No.: WO2021/246064
PCT Pub. Date: Dec. 9, 2021

(65) Prior Publication Data
US 2023/0194448 A1    Jun. 22, 2023

(30) Foreign Application Priority Data

Jun. 4, 2020  (JP) ................................. 2020-098052

(51) Int. Cl.
*G01N 24/10*  (2006.01)
*G01N 21/64*  (2006.01)
*G02B 17/00*  (2006.01)

(52) U.S. Cl.
CPC ............. *G01N 24/10* (2013.01); *G01N 21/64* (2013.01); *G02B 17/004* (2013.01); *G01N 2201/0636* (2013.01)

(58) Field of Classification Search
CPC ................... G01N 24/10; G01N 21/64; G01N 2201/0636; G02B 17/004
See application file for complete search history.

(56) References Cited

U.S. PATENT DOCUMENTS 11,933,865  B2 *  3/2024  Yoshii .................... G01R 33/24
2023/0184853 A1 *  6/2023  Yoshii .................... G01R 33/02
                                                                324/301

OTHER PUBLICATIONS

Takemura et al. (JP 2020-176994 A) with machine translation of abstract. Pub date Oct. 29, 2020 (Year: 2020).*

(Continued)

*Primary Examiner* — Rodney A Bonnette

(57) ABSTRACT

A substrate 1 includes a color center excited by excitation light, and at least a pair of reflection members 21a, 21b are arranged with gaps from the substrate 1. The substrate 1 causes the excitation light entering the substrate 1 to exit through its surfaces without reflection, and the reflection members 21a, 21b cause the exited excitation light to reflect at the reflection surface 21-1 or 21-2 and enter the substrate 1, and cause the excitation light to repeatedly enter and exit the substrate 1 and thereby pass through the substrate 1 only a predetermined number of times. Here, the irradiating device 4 emits the excitation light such that the excitation light is incident to the reflection surface 21-1 or 21-2 with an angle perpendicular to one axis among two axes of the reflection surface 21-1 or 21-2 and with a predetermined slant angle from the other axis.

6 Claims, 10 Drawing Sheets

(56) References Cited

OTHER PUBLICATIONS

S. Steinert, F. Dolde, P. Neumann, A. Aird, B. Naydenov, G. Balasubramanian, F. Jelezko, and J. Wrachtrup; "High sensitivity magnetic imaging using an array of spins in diamond", Review of Scientific Instrument 81, 043765, 2010.

* cited by examiner

EXCITATION LIGHT IRRADIATING APPARATUS AND EXCITATION LIGHT IRRADIATING METHOD

TECHNICAL FIELD

The present invention relates to an excitation light irradiating apparatus and an excitation light irradiating method.

BACKGROUND ART

Recently, developed is a magnetic measurement method based on Optically Detected Magnetic Resonance (ODMR) using a color center.

In ODMR, a medium that has sublevels and optical transition levels is irradiated with a high-frequency magnetic field (microwave) and light for excitation between the sublevels and the optical transition levels, and thereby a population change or the like due to magnetic resonance between the sublevels is detected as an optical signal with high sensitivity. In general, after an electron in a ground state is excited with green light, the electron emits red light when returning to the ground state. For example, after an electron is irradiated with a high-frequency magnetic field of about 2.87 GHz in a nitrogen and a lattice defect in a diamond structure (NV Center: Nitrogen Vacancy Center) and thereby the electron is initialized on the basis of photoexcitation, the electron moves from the lowest level (spin magnetic quantum number ms=0) among three sublevels of the ground state to an energy level (ms=+1 or −1) higher than the lowest level among the three sublevels. When the electron in such state is irradiated with green light, an emitting light intensity is decreased because of no radiation transition to the lowest level (ms=0) of the three sublevels of the ground level; and therefore, by detecting this light, it can be determined whether magnetic resonance occurs due to the high-frequency magnetic field. As mentioned, ODMR uses an optically detected magnetic resonance member such as a diamond including an NVC.

A magnetic measurement method using an NVC causes laser light to enter a diamond substrate including an NVC, causes fluorescence emitted by the NVC irradiated with the laser light to exit the diamond substrate, and detects the fluorescence that exited the diamond substrate using a CCD (Charge Coupled Device) (see NON PATENT LITERATURE #1, for example).

CITATION LIST

Patent Literature

NON PATENT LITERATURE #1: "High sensitivity magnetic imaging using an array of spins in diamond", S. STEINERT, F. DOLDE, P. NEUMANN, A. AIRD, B. NAYDENOV, G. BALASUBRAMANIAN, F. JELEZKO, AND J. WRACHTRUP, Review of Scientific Instrument 81, 043705, 2010.

SUMMARY OF INVENTION

Technical Problem

In the aforementioned magnetic measurement method, a long optical path of the laser light in the diamond substrate is favorable for increasing a light amount of the fluorescence from the color center such as NVC, and therefore, it is proposed that the laser light traveling the inside of the substrate is repeatedly totally-reflected by a surface of the substrate.

However, if the laser light traveling the inside of the substrate is totally-reflected by a surface of the substrate a lot of times for obtaining a long optical path, as the aforementioned magnetic measurement method, then the number of times of the reflection (and therefore a length of the optical path) of the laser light traveling the inside of the substrate tends to get irregular due to an error on an incident angle and/or an incident position of the laser light from the outside to the inside of the substrate.

When the optical path (a length of the optical path) of the laser light traveling the inside of the substrate is irregular, intensity fluctuation of the aforementioned fluorescence due to the aforementioned error on the incident angle and/or the incident position affects a measurement result of the magnetic measurement or the like, and thereby measurement accuracy (measurement error) of the magnetic measurement is not uniform and the measurement is not performed accurately.

The present invention has been conceived in view of the aforementioned problem, and it is an object of the present invention to obtain an excitation light irradiating apparatus and an excitation light irradiating method that enable to stably perform accurate measurement based on the light emitted by the color center in the substrate.

Solution to Problem

An excitation light irradiating apparatus according to the present invention includes a substrate that includes a color center to be excited by excitation light; at least a pair of reflection members that are arranged with gaps from the substrate and have reflection surfaces, respectively; and an irradiating device that emits the excitation light. The substrate causes the excitation light entering the substrate to exit through two surfaces of the substrate that face each other without reflection. The aforementioned at least the pair of the reflection members causes the excitation light that exited the substrate to reflect at the reflection surface and enter the substrate and causes the excitation light to repeatedly enter and exit the substrate, and thereby causes the excitation light to pass through the substrate only a predetermined number of times. The irradiating device emits the excitation light such that the excitation light is incident to the reflection surface both with an angle perpendicular to one axis among two axes of the reflection surface and with a predetermined slant angle from the other axis among the two axes of the reflection surface.

An excitation light irradiating method according to the present invention includes the steps of: (a) causing the excitation light entering a substrate to exit the substrate through a surface of the substrate without reflection; (b) using at least a pair of reflection members that are arranged with gaps from the substrate and have reflection surfaces, respectively, causing the excitation light that exited the substrate to reflect at the reflection surface and enter the substrate and causing the excitation light to repeatedly enter and exit the substrate, and thereby causing the excitation light to pass through the substrate only a predetermined number of times; and (c) causing the excitation light to be incident to the reflection surface both with an angle perpendicular to one axis among two axes of the reflection surface and with a predetermined slant angle from the other axis among the two axes of the reflection surface.

Advantageous Effect of Invention

By means of the present invention, obtained are an excitation light irradiating apparatus and an excitation light irradiating method that enable to stably perform accurate measurement based on light emitted by a color center in a substrate.

DESCRIPTION OF EMBODIMENTS

Hereinafter, embodiments according to aspects of the present invention will be explained with reference to a drawing.

Embodiment 1

Figure 1:
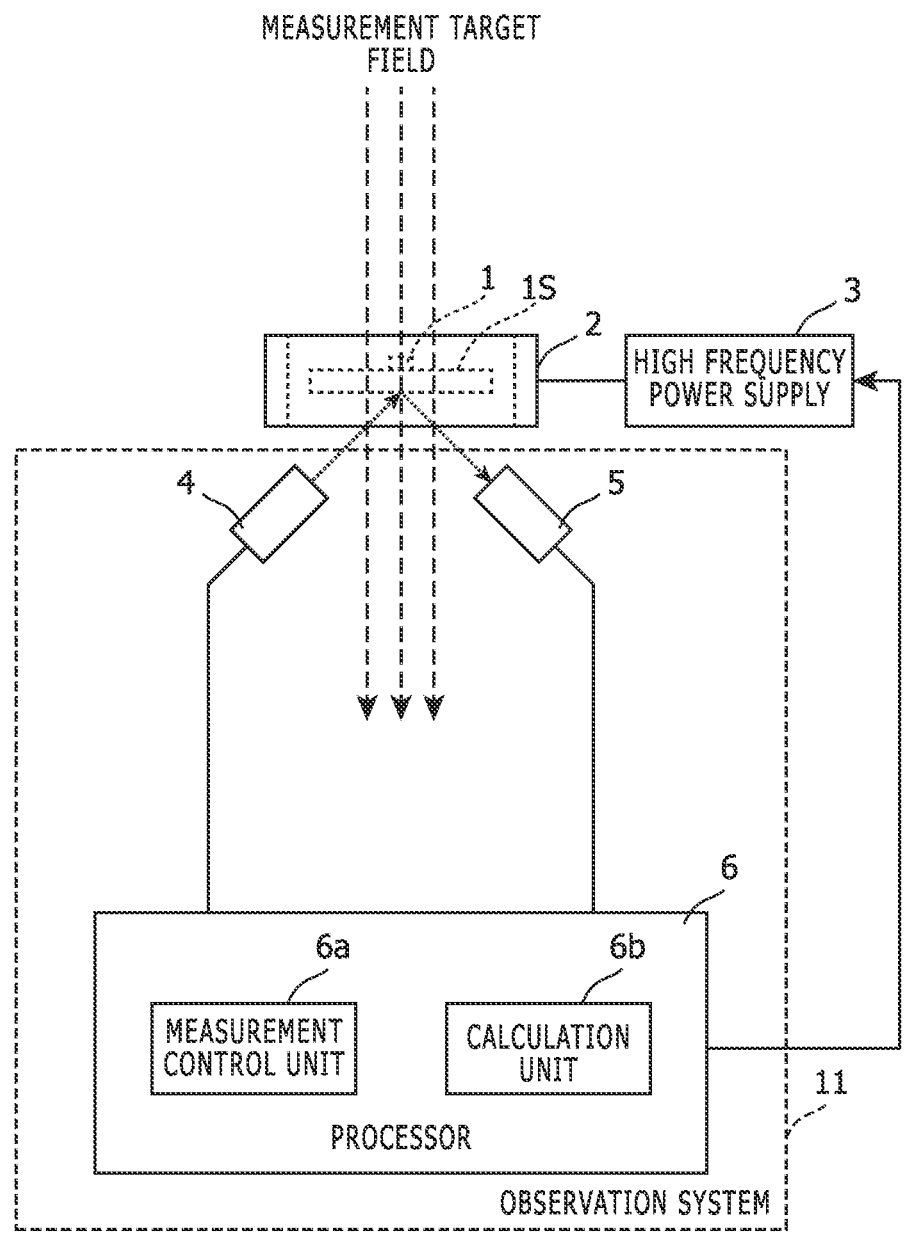
FIG. 1 shows a diagram that indicates an example of a configuration of a measurement apparatus that includes an excitation light irradiating apparatus in Embodiment 1 of the present invention.

FIG. 1 shows a diagram that indicates an example of a configuration of a measurement apparatus that includes an excitation light irradiating apparatus in Embodiment 1 of the present invention. As an example, the measurement apparatus shown in FIG. 1 measures an intensity of a measurement target field such as magnetic field or electric field in accordance with an Optically Detected Magnetic Resonance (ODMR) manner. The measurement apparatus includes a substrate 1 that includes a color center to be excited by excitation light. The substrate 1 includes one or plural color centers. In Embodiment 1, the substrate 1 has a substantial rectangular shape, and has four surfaces (planes) in parallel with each other in longitudinal direction of the substrate.

In this embodiment, the substrate 1 is an electron spin resonance member, and this electron spin resonance member is arranged in a measurement target field (measurement target magnetic field or measurement target electric field). In a predetermined measurement sequence mentioned below, an electron spin quantum operation based on Rabi oscillation is performed for this electron spin resonance member.

It should be noted that the measurement method for the measurement target field is not limited to an ODMR manner, and may be another manner that uses an electron spin quantum operation based on Rabi oscillation. Further, in this embodiment, the substrate 1 is a member such as diamond including an NVC for ODMR, and is fixed to a support member 1S. The substrate 1 as an electron spin resonance member for ODMR is not limited to a diamond including an NVC, and may include another color center (e.g. GeV center or the like).

The measurement apparatus shown in FIG. 1 includes a coil 2 and a high frequency power supply 3 for microwave generation.

The coil 2 generates microwave (magnetic field) for performing an electron spin quantum operation based on Rabi oscillation for one or plural color centers in the substrate 1 as an electron spin resonance member, and applies the microwave (magnetic field) to the substrate 1 (color center(s)). In this embodiment, for example, the coil 2 is obtained by forming a round shape using a plate electric conductor, and the substrate is arranged in a hollow part formed by a round shape part of the coil 2, the inside of the round shape part. The aforementioned color center(s) is/are irradiated with the microwave, and used for determining an intensity or the like of the measurement target field generated by a measurement target.

In Embodiment 1, the coil 2 applies to the substrate 1 the microwave (a magnetic field of it) for performing an electron spin quantum operation based on Rabi oscillation for the aforementioned color center(s). A frequency of the microwave is set correspondingly to a type of the substrate 1 (electron spin resonance member). For example, if the substrate 1 is a diamond including an NVC, the coil 2 applies a microwave magnetic field of about 2.87 GHz. The high frequency power supply 3 causes the coil 2 to conduct a current of a microwave (i.e. a current to generate the aforementioned microwave magnetic field).

Further, the measurement apparatus shown in FIG. 1 includes as an observation system 11 an irradiating device 4, a light receiving device 5, and a processor 6. The observation system 11 determines an intensity of a measurement target field using the substrate 1 that is an electron spin resonance member irradiated with the aforementioned microwave.

The irradiating device 4 is a device that emits excitation light of a predetermined wave length and measurement light of a predetermined wave length, and irradiates the substrate 1 with the excitation light and the measurement light (causes the excitation light and the measurement light to enter the substrate 1). The light receiving device 5 detects fluorescence emitted from the substrate 1 when the substrate 1 is irradiated with the measurement light.

The processor 6 includes a computer, for example, and executes a program using the computer and thereby acts as sorts of processing units. In this embodiment, the processor 6 acts as a measurement control unit 6a and a calculation unit 6b.

The measurement control 6a controls the high frequency power supply 3 and the irradiating device 4 and detects a physical phenomenon in the aforementioned color center and thereby derives a detection value of the physical phenomenon. The physical phenomenon occurs by performing a predetermined measurement sequence corresponding to the measurement target field. Here, the measurement control 6a controls the high frequency power supply 3 and the irradiating device 4 in the predetermined measurement sequence, and determines as the detection value a detection light amount of the fluorescence (the physical phenomenon) detected by the light receiving device 5.

For example, the irradiating device 4 includes a light source as a laser diode or the like, and an optical system that guides light (the excitation light) emitted by the light source and causes the light to enter the substrate 1 with a predetermined incident angle and a predetermined incident position. Further, for example, the light receiving device 5 includes a photo detector element such as a photo diode or the like. Furthermore, for example, the measurement control unit 6a determines the aforementioned detection light amount on the basis of an output signal of the light receiving device 5 obtained by performing amplification and/or the like for an output signal of the photo detector element. In this embodiment, as the aforementioned predetermined measurement sequence, Ramsey pulse sequence, Spin Echo pulse sequence or the like is selected and applied correspondingly to the measurement target field. This measurement sequence is not limited to Ramsey pulse sequence or Spin Echo pulse sequence.

The calculation unit 6b calculates a measurement value (e.g. an amplitude, a direction and/or the like of magnetic flux density) on the basis of the detection value of the aforementioned physical phenomenon (the aforementioned detection light amount) in accordance with a predetermined calculation formula.

Figure 2:
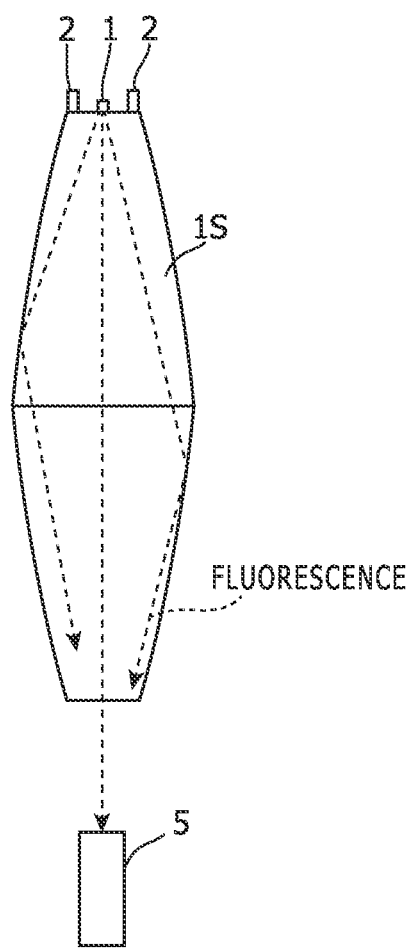
FIG. 2 shows a diagram that indicates an example of an optical system in the measurement apparatus shown in FIG. 1.

FIG. 2 shows a diagram that indicates an example of an optical system in the measurement apparatus shown in FIG. 1. The optical system in this measurement apparatus includes a pair of compound parabolic concentrators (CPCs) as the supporting member 1S. Large-diameter end surfaces of the two CPCs in the pair make contact with each other, and light (i.e. fluorescence emitted by the color center) enters through a small-diameter end surface of one of the CPCs and exits through a small-diameter end surface of the other of the CPCs. The fluorescence generated by the color center in the substrate 1 passes through the supporting member 1S as mentioned, and enters the light receiving device 5. The excitation light and the measurement light from the irradiating device 4 do not pass through the supporting member 1S, and the substrate 1 is irradiated with the excitation light and the measurement light.

Figure 3:
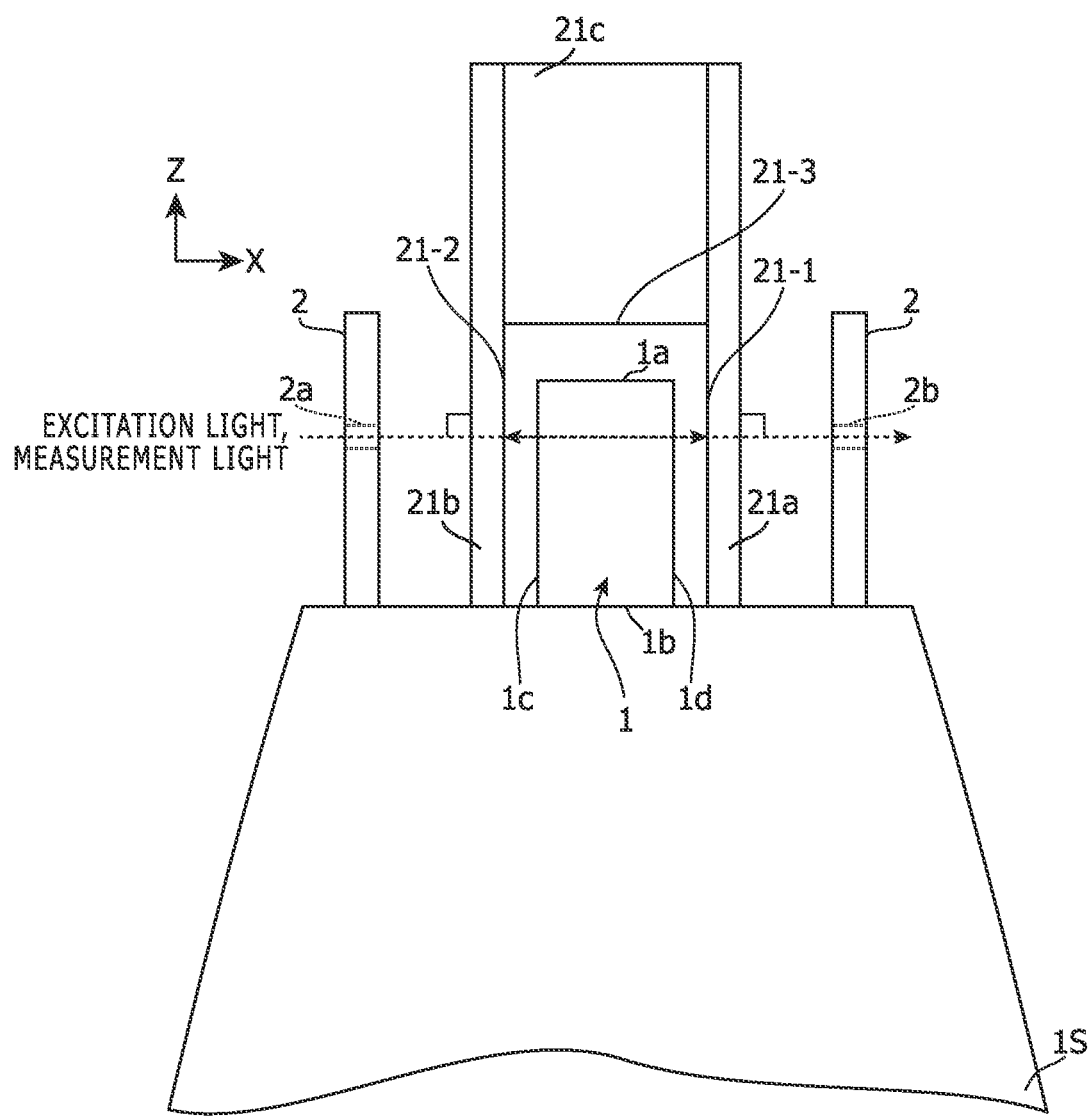
FIG. 3 shows a cross-sectional diagram that indicates a configuration of the excitation light irradiating apparatus in Embodiment 1.

The aforementioned measurement apparatus includes an excitation light irradiating apparatus including an optical system around the substrate 1. FIG. 3 shows a cross-sectional diagram that indicates a configuration of the excitation light irradiating apparatus in Embodiment 1.

This excitation light irradiating apparatus includes the aforementioned substrate 1, at least a pair of (at least two) reflection members 21a, 21b arranged with a gap from the substrate 1, and a reflection member 21c.

The substrate 1 has a top surface 1a, a bottom surface 1b, and side surfaces 1c, 1d, as shown in FIG. 3 for example, and causes excitation light entering this substrate 1 to exit the substrate 1 through the side surfaces 1c, 1d without reflection. Thus, the excitation light passes through the substrate 1 plural times without any reflection in the substrate 1.

The reflection members 21a, 21b have planar shapes, for example, and have reflection surfaces 21-1, 21-2, respectively. These reflection members 21a, 21b cause the excitation light that exited the substrate 1 to reflect at the reflection surface 21-1 or 21-2 and enter the substrate 1 and cause the excitation light to repeatedly enter and exit the substrate 1, and thereby cause the excitation light to pass through the substrate 1 only a predetermined number of times.

In this embodiment, the reflection surfaces 21-1, 21-2 are in parallel with each other, the side surfaces 1c, 1d are in parallel with each other, and the reflection surfaces 21-1, 21-2 and the side surfaces 1c, 1d are in parallel with each other.

The reflection member 21c has a reflection surface 21-3 facing the substrate 1. This reflection surface 21-3 is for causing the fluorescence emitted by the substrate 1 (the color center(s)), and the aforementioned excitation light is not incident to the reflection member 21c and the supporting member 1S.

In this embodiment, the reflection members 21a, 21b are connected to both sides of the reflection member 21c of substantially rectangular shape, respectively; a shape of the reflection members 21a, 21b, 21c are a half-pipe shape; and the substrate 1 is arranged in an inner space of the half-pipe shape. In Embodiment 1, the reflection member 21c does not reflect the excitation light but reflects the aforementioned fluorescence toward the CPC as the supporting member 1S with the reflection members 21a, 21b. In Embodiment 1, the reflection member 21c may not be installed or non-reflection member of the same shape may be used instead of the reflection member 21c, because the reflection member 21c does not reflect the excitation light.

Figure 4:
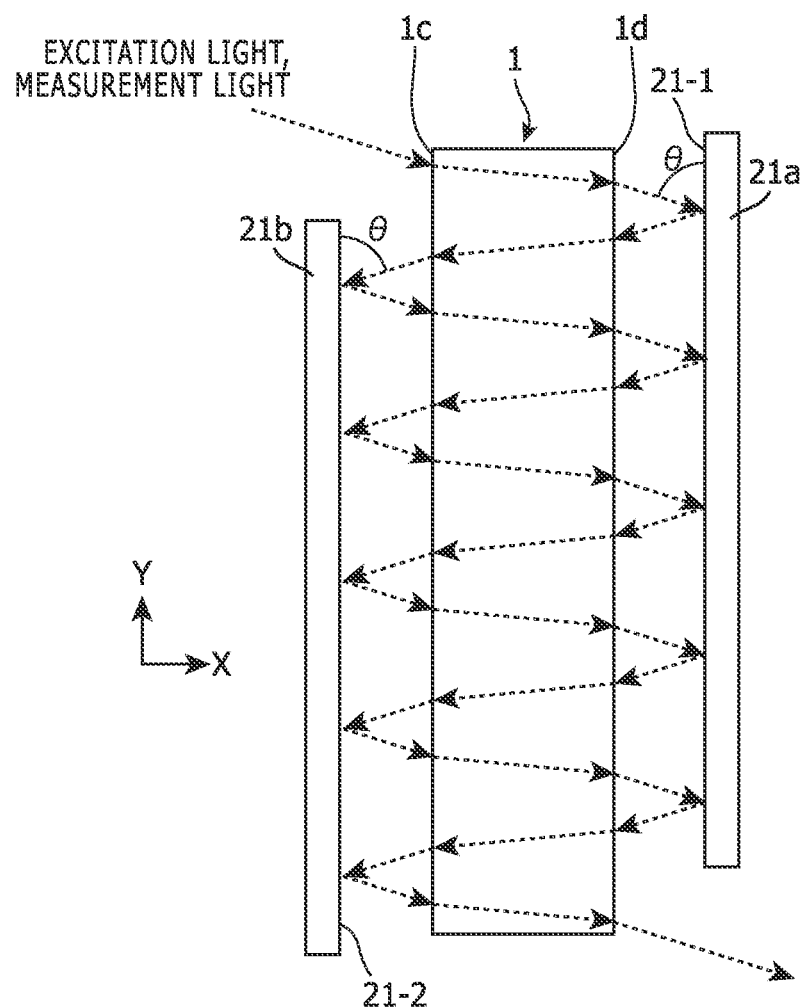
FIG. 4 shows a front view diagram that explains a substrate 1, reflection members 21a, 21b and an optical path of excitation light in Embodiment 1.

FIG. 4 shows a front view diagram that explains a substrate 1, reflection members 21a, 21b and an optical path of excitation light in Embodiment 1. The reflection members 21a, 21b shown in FIG. 4 are planar members that have reflection surfaces 21-1, 21-2. For example, each of the reflection members 21a, 21b includes an optical transparent member such as glass or transparent resin, and a coat or film that forms the reflection surface 21-i (i=1, 2) on a surface of the optical transparent member. For example, the reflection surfaces 21-1, 21-2 are formed with dielectric multilayer. In this embodiment, each of the reflection members 21a, 21b, 21c are a single member. Alternatively, the reflection member 21a, 21b or 21c may be an assembly of plural members.

Here, the irradiating device 4 emits the excitation light, for example, as shown in FIGS. 3 and 4, such that the excitation light is incident to the reflection surface 21-1 or 21-2 both with an angle perpendicular to one axis Z among two axes Y, Z (i.e. two axes that span a plane of the reflection surface 21-1 or 21-2) of the reflection surface 21-1, 21-2 and with a predetermined slant angle θ (less than 90 degrees) from the other axis Y among the two axes Y, Z of the reflection surface 21-1 or 21-2.

Further, in this embodiment, the coil 2 includes an entering-side penetration hole 2a as shown in FIG. 3 for example, and the entering-side penetration hole 2a is arranged such that the excitation light enters the substrate 1 through the entering-side penetration hole 2a. The entering-side penetration hole 2a may not be formed, and an optical path of the excitation light may be set using a mirror and/or the like such that the coil 2 does not interfere with the optical path of the excitation light.

Further, in this embodiment, the coil 2 includes an exiting-side penetration hole 2b as shown in FIG. 3 for example. The exiting-side penetration hole 2b is arranged such that the excitation light passes through the entering-side penetration hole 2b after the excitation light passed through the substrate 1 the aforementioned predetermined number of times. The exiting-side penetration hole 2b may not be formed, and an optical path of the excitation light may be set using a mirror and/or the like such that the coil 2 does not interfere with the optical path of the excitation light. Further, as mentioned, the coil 2 is not irradiated with the excitation light that passed through the substrate 1 and thereby restrained are heating and temperature increase of the apparatus due to irradiation of the coil 2 with the excitation light.

After passing through the substrate 1 the predetermined number of times, the excitation light is terminated at a beam damper or the like (here, after passing the exiting-side penetration hole 2*b*) so as not to re-enter the substrate 1.

The following part explains a behavior of the excitation light irradiating apparatus in Embodiment 1.

This excitation light irradiating apparatus is arranged in a measurement target field near a measurement target. Subsequently, the measurement control unit 6*a* performs the aforementioned measurement sequence and performs measurement of an intensity of the measurement target field with the calculation unit 6*b*.

In the aforementioned measurement sequence, when an irradiation timing of the excitation light comes, the irradiating device 4 emits the excitation light. As shown in FIGS. 3 and 4, for example, the excitation light emitted from the irradiating device 4 is incident to the side surface 1*c* or 1*d* of the substrate 1 with a predetermined incident angle and travels in the substrate 1. In other words, the irradiating device 4 emits the excitation light so as to be incident to the substrate 1 with the aforementioned incident angle. Subsequently, the excitation light exits through the side surface 1*d* or 1*c* facing the side surface 1*c* or 1*d* through which the excitation light entered.

Subsequently, as shown in FIGS. 3 and 4, the excitation light repeatedly reflects at the reflection surfaces 21-1, 21-2, travels in a zigzag toward the Y axis direction, and thereby passes through the substrate 1 the predetermined times. Thereby, in the substrate 1, the color center that exists on an optical path of the excitation light is excited by the excitation light.

Afterward, when an irradiating timing of the measurement light comes, the irradiating device 4 emits the measurement light. The measurement light travels along the same optical path as that of the excitation light, and when the measurement light travels, the fluorescence occurs in the color center and enters the CPC as the supporting member 1S either directly or with reflection at the reflection members 21*a*, 21*b*, 21*c* around the substrate 1, and converges to the light receiving device 5 by the CPC. The fluorescence received by the light receiving device 5 is converted to an electric signal. Subsequently, the measurement control unit 6*a* determines a detection value (an intensity of the fluorescence) on the basis of the electric signal, and the calculation unit 6*b* calculates a measurement value of the measurement target field from the detection value.

As mentioned, the excitation light irradiating apparatus in Embodiment 1 includes the substrate 1 that includes a color center to be excited by excitation light, and at least a pair of reflection members 21*a*, 21*b* that are arranged with gaps from the substrate 1 and have reflection surfaces 21*a*, 21*b*, respectively. Further, the substrate 1 causes the excitation light entering the substrate 1 to exit through surfaces 1*c*, 1*d* of the substrate 1 without reflection; and the reflection members 21*a*, 21*b* cause the excitation light that exited the substrate 1 to reflect at the reflection surfaces 21-1, 21-2 and enter the substrate 1, and causes the excitation light to repeatedly enter and exit the substrate 1, and thereby causes the excitation light to pass through the substrate 1 only a predetermined number of times. Here, the irradiating device 4 emits the excitation light such that the excitation light is incident to the reflection surface 21-1 or 21-2 both with an angle perpendicular to one axis among two axes of the reflection surface and with a predetermined slant angle from the other axis among the two axes of the reflection surface.

Consequently, an optical path of the excitation light is set with the reflection members 21*a*, 21*b* arranged the outside of the substrate 1 such that the excitation light passes through the substrate 1 only a predetermined number of times without internal reflection in the substrate 1, and therefore, even if an incident angle or an incident position of the excitation light to the substrate 1 from the irradiating device 4 slightly fluctuates, the number of passing times of the excitation light does not change (i.e. an optical path length of the excitation light in the substrate 1 does not largely change). Therefore, the accurate measurement is stably performed on the basis of the light emitted by the color center in the substrate 1.

Further, the irradiating device 4 is set such that the excitation light is incident with an angle perpendicular to one axis among two axes of the reflection surface 21-1 or 21-2 (i.e. the excitation light travels on one plane in parallel with a reference surface (here, a top surface of the supporting member 1S) on which the substrate 1 is arranged), and therefore, the optical path is just controlled 2-dimensionally rather than 3-dimensionally, and consequently, a fluctuation amount of the optical path of the excitation light (and the measurement light) tends not to get large.

Embodiment 2

Figure 5:
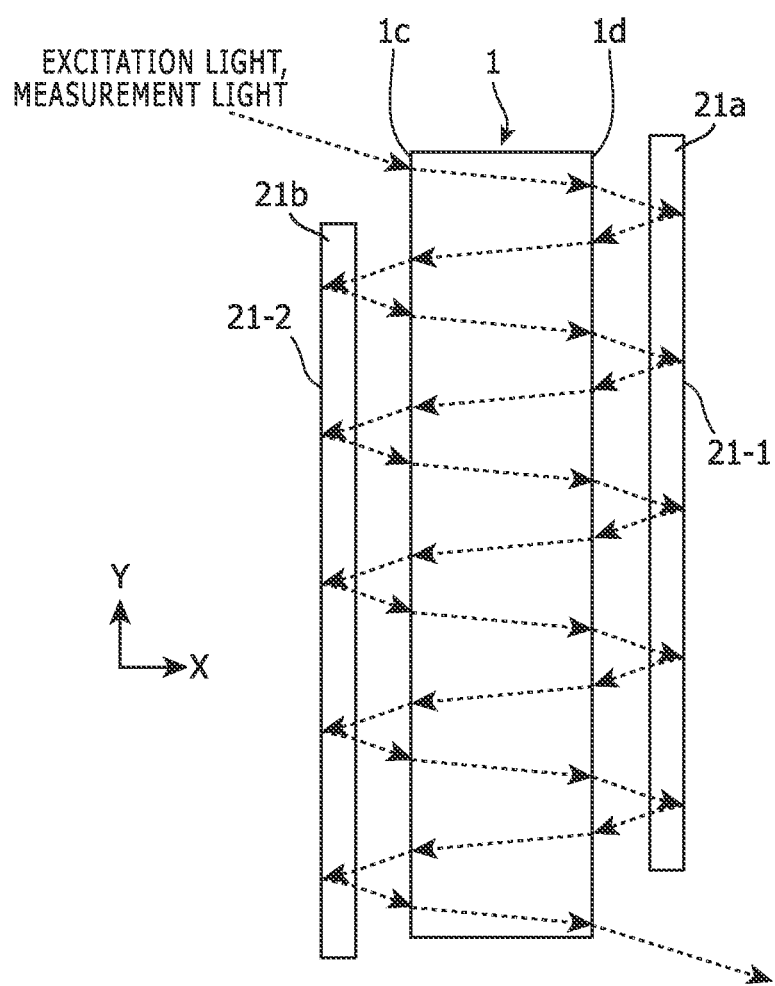
FIG. 5 shows a front view diagram that explains a substrate 1, reflection members 21a, 21b and an optical path of excitation light in Embodiment 2.

FIG. 5 shows a front view diagram that explains a substrate 1, reflection members 21*a*, 21*b* and an optical path of excitation light in Embodiment 2.

In Embodiment 2, the reflection members 21*a*, 21*b* are arranged such that the reflection surfaces 21-1, 21-2 of the reflection members 21*a*, 21*b* are arranged outside (i.e. in opposite sides to surfaces facing the substrate 1), and thereby, the excitation light is incident to the reflection surfaces 21-1, 21-2 through the optical transparent member. It should be noted that in Embodiment 1 (FIG. 4) the excitation light is incident to the reflection surfaces 21-1, 21-2 not through the optical transparent member of the reflection members 21*a*, 21*b*.

Further, in Embodiments 1 and 2, the excitation light does not pass the optical transparent member of the reflection member 21*a* or 21*b* before firstly entering the substrate 1 on the optical path, and directly enters the substrate 1. Furthermore, in Embodiments 1 and 2, the excitation light does not pass the optical transparent member of the reflection member 21*a* or 21*b* after finally exiting the substrate 1 on the optical path.

Other parts of the configuration and behaviors of the excitation light irradiating apparatus in Embodiment 2 are identical or similar to those in Embodiment 1, and therefore not explained here.

Embodiment 3

Figure 6:
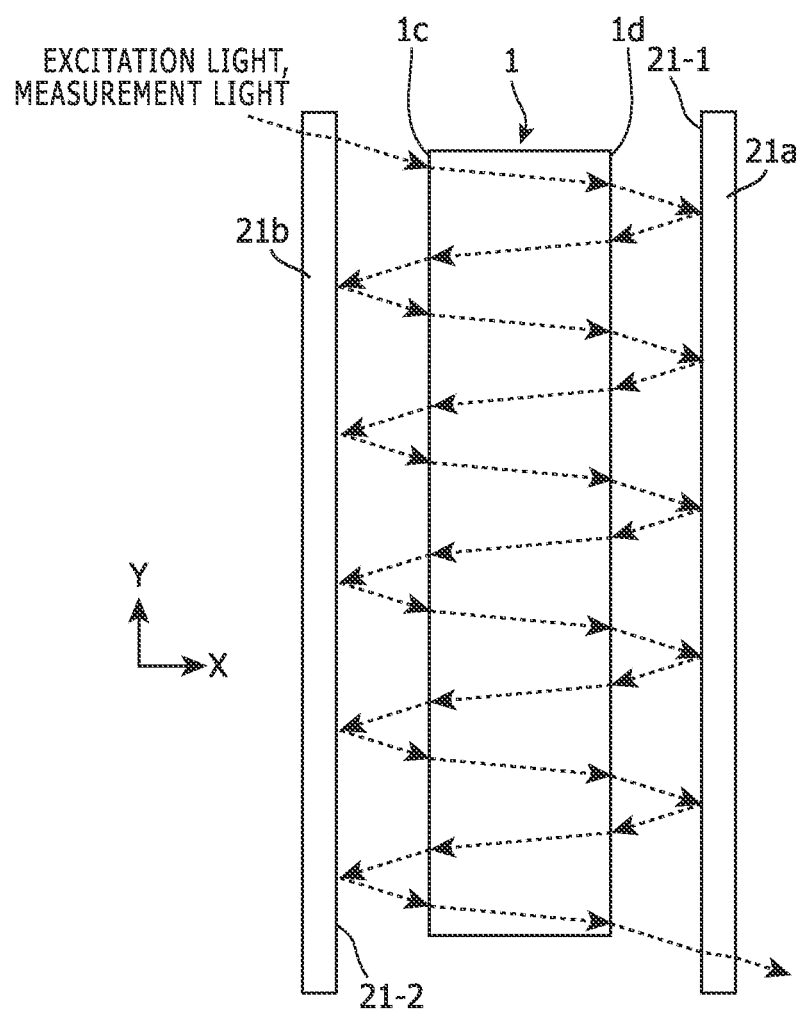
FIG. 6 shows a front view diagram that explains a substrate 1, reflection members 21a, 21b and an optical path of excitation light in Embodiment 3.

FIG. 6 shows a front view diagram that explains a substrate 1, reflection members 21*a*, 21*b* and an optical path of excitation light in Embodiment 3.

In Embodiment 3, the reflection members 21*a*, 21*b* are arranged such that the reflection surfaces 21-1, 21-2 of the reflection members 21*a*, 21*b* are arranged inside as well as in Embodiment 1 (i.e. so as to face the substrate 1), and thereby, the excitation light is incident to the reflection surfaces 21-1, 21-2 not through the optical transparent member of the reflection members 21a, 21b.

However, in Embodiment 3, as shown in FIG. 6, for example, when firstly entering the substrate 1 on the optical path, the excitation light enters the substrate 1 through the optical transparent member of the reflection members 21a, 21b. Further, in Embodiment 3, the excitation light passes through the optical transparent member of the reflection members 21a, 21b after finally exiting the substrate 1 on the optical path. Therefore, the reflection surfaces 21-1, 21-2 are not formed at a part that the excitation light passes through of the reflection members 21a, 21b.

Other parts of the configuration and behaviors of the excitation light irradiating apparatus in Embodiment 3 are identical or similar to those in Embodiment 1, and therefore not explained here.

Embodiment 4

Figure 7:
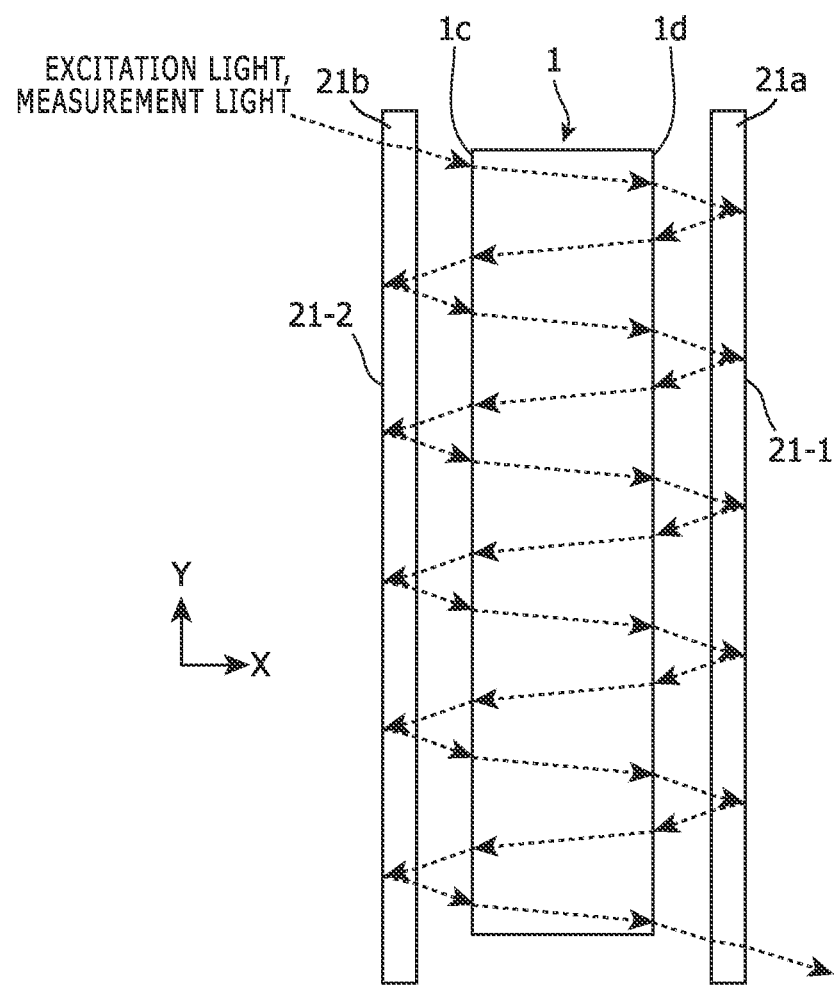
FIG. 7 shows a front view diagram that explains a substrate 1, reflection members 21a, 21b and an optical path of excitation light in Embodiment 4.

FIG. 7 shows a front view diagram that explains a substrate 1, reflection members 21a, 21b and an optical path of excitation light in Embodiment 4.

In Embodiment 4, as well as in Embodiment 2, the reflection members 21a, 21b are arranged such that the reflection surfaces 21-1, 21-2 of the reflection members 21a, 21b are arranged outside (i.e. in opposite sides to surfaces facing the substrate 1), and thereby, the excitation light is incident to the reflection surfaces 21-1, 21-2 through the optical transparent member of the reflection members 21a, 21b.

Further, in Embodiment 4, as well as in Embodiment 3, as shown in FIG. 7, for example, when firstly entering the substrate 1 on the optical path, the excitation light enters the substrate 1 through the optical transparent member of the reflection members 21a, 21b. Further, in Embodiment 4, the excitation light passes through the optical transparent member of the reflection members 21a, 21b after finally exiting the substrate 1 on the optical path. Therefore, the reflection surfaces 21-1, 21-2 are not formed at a part that the excitation light passes through of the reflection members 21a, 21b.

Other parts of the configuration and behaviors of the excitation light irradiating apparatus in Embodiment 4 are identical or similar to those in Embodiment 1, and therefore not explained here.

Embodiment 5

Figure 8:
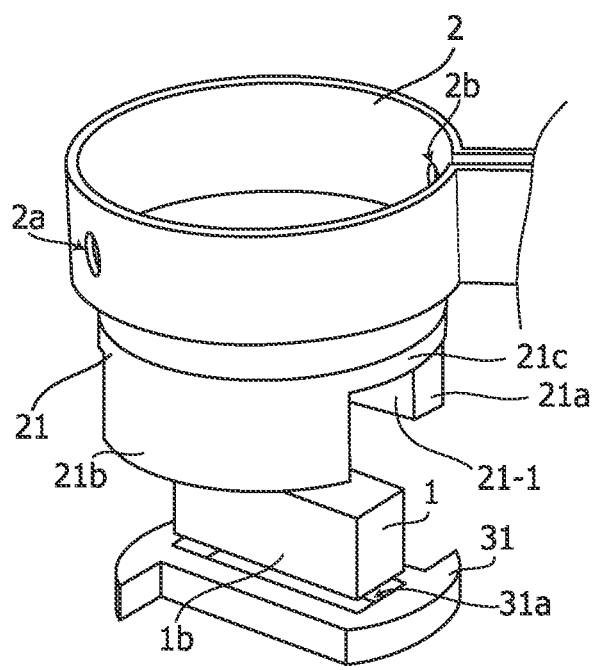
FIG. 8 shows a perspective view diagram that indicates an example of a configuration of the excitation light irradiating apparatus in Embodiment 5.

FIG. 8 shows a perspective view diagram that indicates an example of a configuration of the excitation light irradiating apparatus in Embodiment 5.

The excitation light irradiating apparatus in Embodiment 5 includes a reflection member 21 as a single member that the aforementioned reflection members 21a, 21b, 21c are combined into, and a jig member 31. An outer shape of the reflection member 21 is substantially a cylindrical shape that has a diameter as substantially same as a diameter of a hollow part of the coil 2, and is fixed to the coil 2 without looseness, and the aforementioned reflection surfaces 21-1, 21-2 are aligned. Further, the jig member 31 includes a penetration hole 31a in which the substrate 1 is arranged without looseness, and is fixed to a bottom part of the reflection member 21 without looseness, and thereby, the substrate 1 is aligned and arranged at a proper position to the reflection surfaces 21-1, 21-2.

Other parts of the configuration and behaviors of the excitation light irradiating apparatus in Embodiment 5 are identical or similar to those in any of Embodiments 1 to 4, and therefore not explained here.

Embodiment 6

Figure 9:
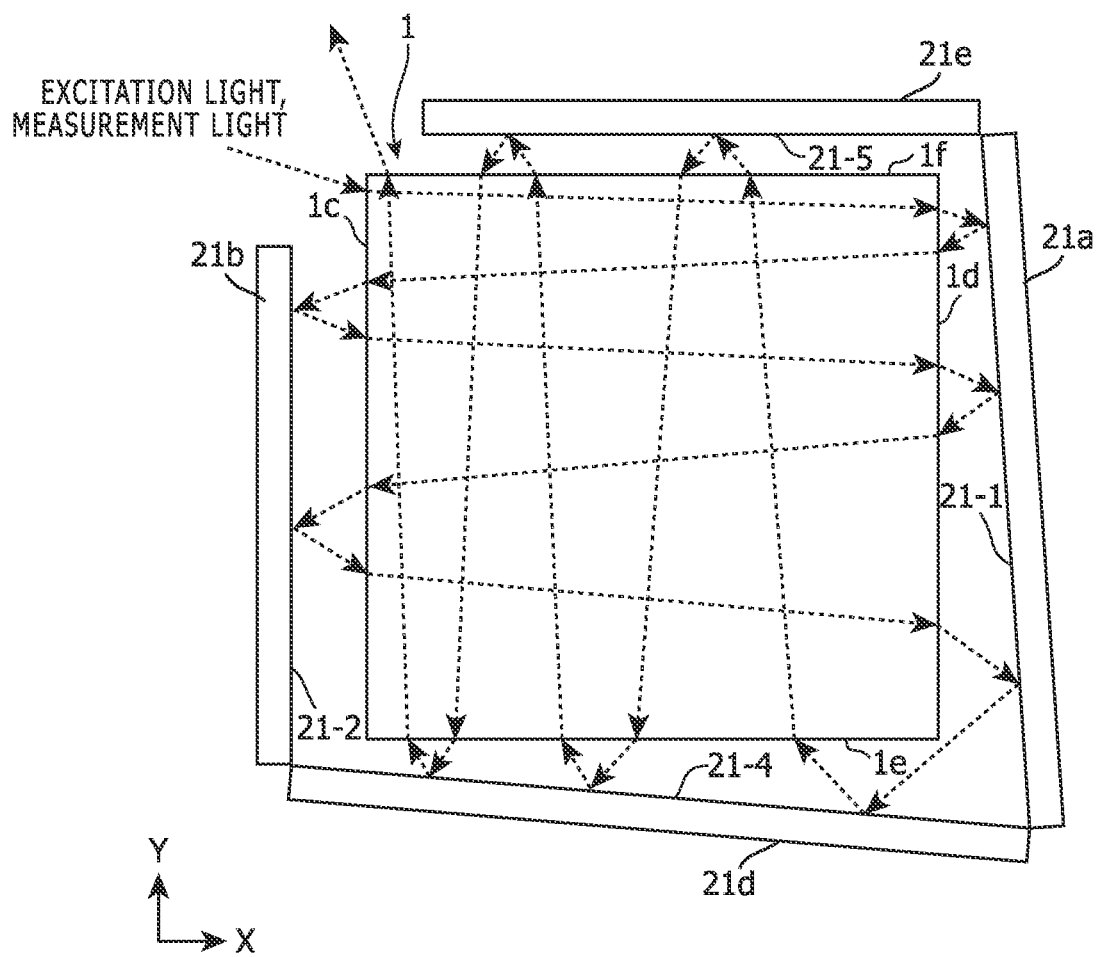
FIG. 9 shows a front view diagram that explains a substrate 1, reflection members 21a, 21b, 21d, 21e and an optical path of excitation light in Embodiment 6.

FIG. 9 shows a front view diagram that explains a substrate 1, reflection members 21a, 21b, 21d, 21e and an optical path of excitation light in Embodiment 6.

The excitation light irradiating apparatus in Embodiment 6 includes at least the pair of the reflection members 21a, 21b as well as those in Embodiments 1 to 5 and at least a pair of reflection members 21d, 21e.

The excitation light exits the substrate 1 through one of a surface 1c and a surface 1d that face each other of the substrate 1, and the reflection members 21a, 21b cause the excitation light that exited the substrate 1 through the surface 1c or 1d to reflect at the reflection surface 21-1 or 21-2 and enter the substrate 1 through the surface through which the excitation light exited among the surfaces 1c and 1d, and causes the excitation light to repeatedly enter and exit the substrate 1, and thereby causes the excitation light to pass through the substrate only a predetermined first number of times.

Further, after the excitation light passed the substrate 1 the aforementioned predetermined number of times, the reflection members 21d, 21e cause the excitation light that exited the substrate 1 through one of a surface 1e and a surface 1f of the substrate 1 different from the surfaces 1c, 1d to reflect at the reflection surface and enter the substrate through the surface through which the excitation light exited among the surfaces 1e, 1f, and causes the excitation light to repeatedly enter and exit the substrate 1, and thereby causes the excitation light to pass through the substrate 1 only a predetermined second number of times. The predetermined second number of times may be identical to the predetermined first number of times or may be different from the predetermined first number of times.

Further, in Embodiment 6, one of the reflection members 21a, 21b causes the excitation light to pass the substrate 1 only the predetermined first number of times and thereafter cause the excitation light to be incident to one of the reflection members 21d, 21e. The excitation light may be incident to one of the reflection members 21d, 21e using another optical system than the reflection members 21a, 21b after the reflection members 21a and 21b cause the excitation light to pass the substrate 1 only the predetermined first number of times.

The reflection members 21d, 21e in FIG. 9 are planar members that have reflection surfaces 21-4, 21-5. For example, each of the reflection members 21d, 21e includes an optical transparent member such as glass or transparent resin, and a coat or film that forms the reflection surface 21-i (i=4, 5) on a surface of the optical transparent member. For example, the reflection surfaces 21-4, 21-5 are formed with dielectric multilayer. In this embodiment, each of the reflection members 21d, 21e are a single member. Alternatively, the reflection member 21d or 21e may be an assembly of plural members.

In Embodiment 6, the reflection surface 21-2 and the surfaces 1c, 1d are substantially parallel to each other, the reflection surface 21-5 and the surfaces 1e, 1f are substantially parallel to each other, and the reflection surface 21-1 is not parallel to the reflection surface 21-2 and slant to the reflection surface 21-2 with a predetermined angle. The reflection surface 21-4 is not parallel to the reflection surface 21-5 and slant to the reflection surface 21-5 with a predetermined angle.

In FIG. 9, the reflection surfaces 21-1, 21-2, 21-4, 21-5 of the reflection members 21a, 21b, 21d, 21e are arranged inside (in a side facing the substrate 1), but as well as in Embodiment 2, the reflection members 21a, 21b, 21d, 21e may be arranged such that the reflection surfaces 21-1, 21-2, 21-4, 21-5 of the reflection members 21a, 21b are arranged outside. Further, in such a case, as well as in Embodiment 4, when firstly entering the substrate 1 on the optical path, the excitation light may enter the substrate 1 through the optical transparent member of the reflection members 21a, 21b, 21d, 21e; and after finally exiting the substrate 1 on the optical path, the excitation light may pass through the optical transparent member of the reflection members 21a, 21b, 21d, 21e (in such a case, the reflection surfaces 21-1, 21-2, 21-4, 21-5 are not formed at a part that the excitation light passes through of the reflection members 21a, 21b, 21d, 21e). Alternatively, as well as in Embodiment 3, in a case that the reflection members 21a, 21b, 21d, 21e are arranged such that the reflection surfaces 21-1, 21-2, 21-4, 21-5 of the reflection members 21a, 21b, 21d, 21e are arranged inside, when firstly entering the substrate 1 on the optical path, the excitation light may enter the substrate 1 through the optical transparent member of the reflection members 21a, 21b, 21d, 21e; and after finally exiting the substrate 1 on the optical path, the excitation light may pass through the optical transparent member of the reflection members 21a, 21b, 21d, 21e (in such a case, the reflection surfaces 21-1, 21-2, 21-4, 21-5 are not formed at a part that the excitation light passes through of the reflection members 21a, 21b, 21d, 21e).

Other parts of the configuration and behaviors of the excitation light irradiating apparatus in Embodiment 6 are identical or similar to those in any of Embodiments 1 to 5, and therefore not explained here.

Embodiment 7

Figure 10:
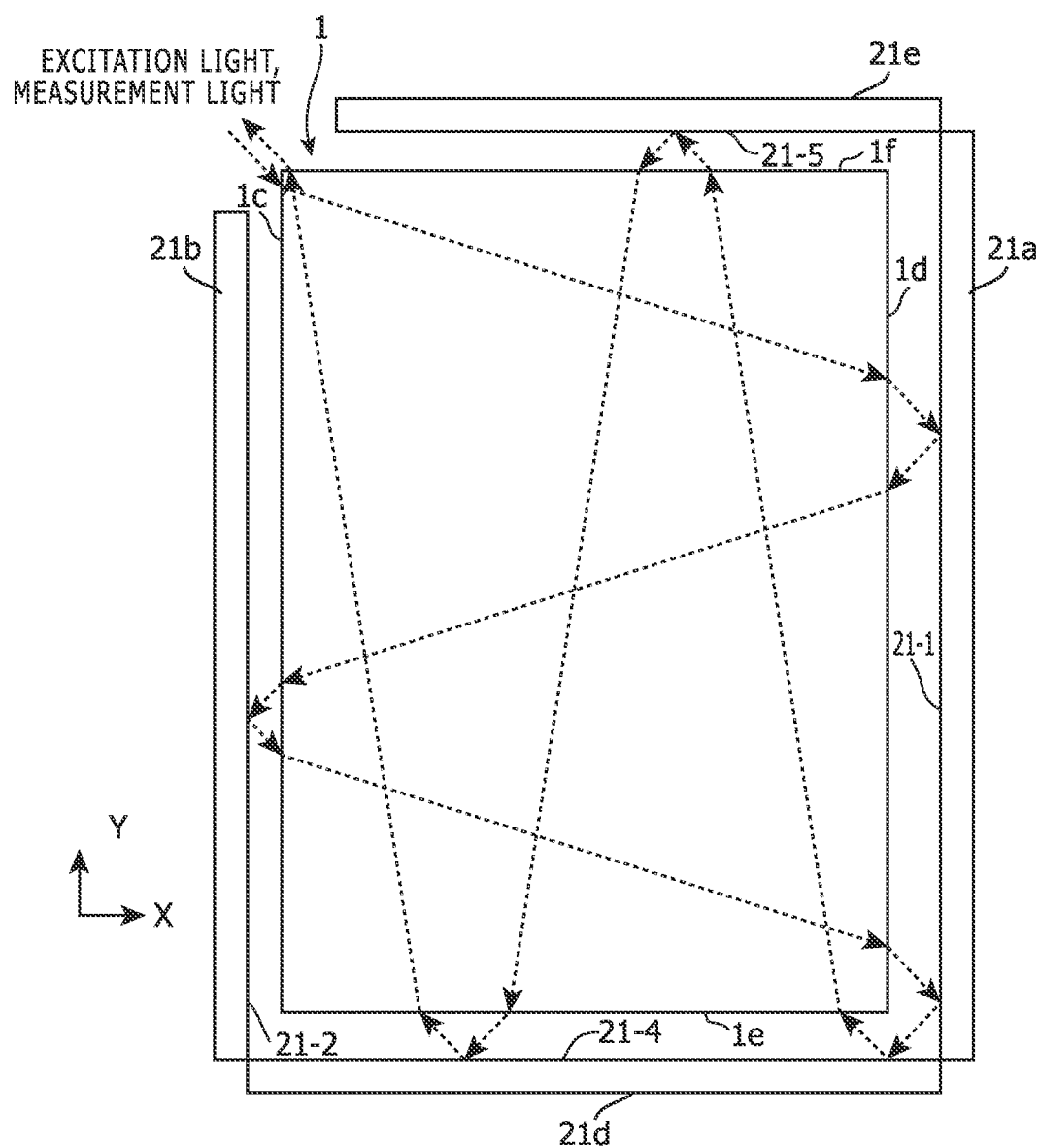
FIG. 10 shows a front view diagram that explains a substrate 1, reflection members 21a, 21b, 21d, 21e and an optical path of excitation light in Embodiment 7.

FIG. 10 shows a front view diagram that explains a substrate 1, reflection members 21a, 21b, 21d, 21e and an optical path of excitation light in Embodiment 7.

In Embodiment 7, the reflection surfaces 21-1, 21-2 are substantially parallel to each other, the surfaces 1c, 1d are substantially parallel to each other, and the reflection surfaces 21-1, 21-2 and the surfaces 1c, 1d are substantially parallel to each other; and the reflection surfaces 21-4, 21-5 are substantially parallel to each other, the surfaces 1e, 1f are substantially parallel to each other, and the reflection surfaces 21-4, 21-5 and the surfaces 1e, 1f are substantially parallel to each other. However, in this embodiment, a distance from the surface 1d to the reflection surface 21-1 is longer than a distance from the surface 1c to the reflection surface 21-2, and a distance from the surface 1e to the reflection surface 21-4 is longer than a distance from the surface 1f to the reflection surface 21-5.

Other parts of the configuration and behaviors of the excitation light irradiating apparatus in Embodiment 7 are identical or similar to those in Embodiment 6, and therefore not explained here.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in Embodiments 1 to 5, the reflection surfaces 21-1, 21-2 are substantially parallel to each other, the reflection surfaces 21-1, 21-2 and the side surfaces 1c, 1d are substantially parallel to each other; and alternatively, the reflection surfaces 21-1, 21-2 may not be parallel to each other. Further, one or both of the reflection surfaces 21-1, 21-2 may not be parallel to the side surfaces 1c, 1d.

Further, in Embodiments 1 to 7, shapes of the reflection surfaces 21-1, 21-2, 21-3, 21-4, 21-5 of the reflection members 21a, 21b, 21c, 21d, 21e are planar shapes; and alternatively, the shapes may be curved shapes.

Furthermore, in Embodiments 1 to 4, 6 and 7, plural reflection members as a part or all of the reflection members 21a, 21b, 21c, 21d may be a single member that has reflection surfaces as same as the reflection surfaces of them, for example, as well as in Embodiment 5.

Furthermore, in Embodiments 1 to 7, the reflection members 21a, 21b, 21c, 21d is apart from the substrate 1, but the reflection members 21a, 21b, 21c, 21d may contact the substrate 1.

INDUSTRIAL APPLICABILITY

For example, the present invention is applicable to measurement of a magnetic field or an electric field based on ODMR or the like.

The invention claimed is:

1. An excitation light irradiating apparatus, comprising:
a substrate that includes a color center to be excited by excitation light;
at least a pair of reflection members that are arranged with gaps from the substrate and have reflection surfaces, respectively; and
an irradiating device that emits the excitation light;
wherein the substrate causes the excitation light entering the substrate to exit through two surfaces of the substrate that face each other without reflection;
at least the pair of the reflection members causes the excitation light that exited the substrate to reflect at the reflection surface and enter the substrate and causes the excitation light to repeatedly enter and exit the substrate, and thereby causes the excitation light to pass through the substrate only a predetermined number of times; and
the irradiating device emits the excitation light such that the excitation light is incident to the reflection surface both with an angle perpendicular to one axis among two axes of the reflection surface and with a predetermined slant angle from the other axis among the two axes of the reflection surface.

2. The excitation light irradiating apparatus according to claim 1, further comprising:
a coil that applies microwave to the color center for performing an electron spin quantum operation of the color center;
a high frequency power supply that causes the coil to conduct a current of the microwave;
a measurement control unit that controls the high frequency power supply and the irradiating device and detects a physical phenomenon in the color center and thereby derives a detection value of the physical phenomenon; and
a calculation unit that calculates a measurement value of a measurement target physical field on the basis of the detection value of the physical phenomenon;
wherein the substrate is arranged in the coil;
the coil comprises an entering-side penetration hole; and the entering-side penetration hole is arranged such that the excitation light enters the substrate through the entering-side penetration hole.

3. The excitation light irradiating apparatus according to claim 2, wherein the coil comprises an exiting-side penetration hole; and the exiting-side penetration hole is arranged such that the excitation light passes through the entering-side penetration hole after the excitation light passed through the substrate the predetermined number of times.

4. The excitation light irradiating apparatus according to claim 1, wherein a first pair of the reflection members among at least the pair of the reflection members causes the excitation light that exited the substrate through one of a first surface and a second surface of the substrate to reflect at the reflection surface and enter the substrate through the surface through which the excitation light exited among the first and the second surfaces, and causes the excitation light to repeatedly enter and exit the substrate, and thereby causes the excitation light to pass through the substrate only a predetermined first number of times; and a second pair of the reflection members different from the first pair among at least the pair of the reflection members causes the excitation light that exited the substrate through one of a third surface and a fourth surface of the substrate different from the first and the second surfaces to reflect at the reflection surface and enter the substrate through the surface through which the excitation light exited among the third and the fourth surfaces, and causes the excitation light to repeatedly enter and exit the substrate, and thereby causes the excitation light to pass through the substrate only a predetermined second number of times.

5. The excitation light irradiating apparatus according to claim 4, wherein the first pair of the reflection members causes the excitation light to be incident to the second reflection member after the excitation light passed through the substrate only the first number of times.

6. An excitation light irradiating method irradiating a color center included in a substrate with excitation light, comprising the steps of:

causing the excitation light entering the substrate to exit the substrate through a surface of the substrate without reflection;

using at least a pair of reflection members that are arranged with gaps from the substrate and have reflection surfaces, respectively, causing the excitation light that exited the substrate to reflect at the reflection surface and enter the substrate and causing the excitation light to repeatedly enter and exit the substrate, and thereby causing the excitation light to pass through the substrate only a predetermined number of times; and causing the excitation light to be incident to the reflection surface both with an angle perpendicular to one axis among two axes of the reflection surface and with a predetermined slant angle from the other axis among the two axes of the reflection surface.

* * * * *